United States Patent
Field et al.

(10) Patent No.: US 10,825,978 B2
(45) Date of Patent: Nov. 3, 2020

(54) STRAND CRITICAL CURRENT DENSITY IN $NB_3SN$ SUPERCONDUCTING STRANDS VIA A NOVEL HEAT TREATMENT

(71) Applicant: Bruker OST LLC, Carteret, NJ (US)

(72) Inventors: Michael Field, Hoboken, NJ (US); Hanping Miao, Edison, NJ (US); Carlos Sanabria, Tallahassee, FL (US); Jeffrey Parrell, Mountainside, NJ (US)

(73) Assignee: Bruker OST LLC, Carteret, NJ (US)

( * ) Notice: Subject to any disclaimer, the term of this patent is extended or adjusted under 35 U.S.C. 154(b) by 240 days.

(21) Appl. No.: 15/879,291

(22) Filed: Jan. 24, 2018

(65) Prior Publication Data

US 2018/0212136 A1 Jul. 26, 2018

Related U.S. Application Data

(60) Provisional application No. 62/450,116, filed on Jan. 25, 2017.

(51) Int. Cl.
| | | |
|---|---|---|
| *H01L 39/24* | (2006.01) | |
| *H01B 12/02* | (2006.01) | |
| *H01L 39/12* | (2006.01) | |
| *H01B 13/00* | (2006.01) | |

(52) U.S. Cl.
CPC ......... *H01L 39/2409* (2013.01); *H01B 12/02* (2013.01); *H01L 39/12* (2013.01); *H01L 39/2403* (2013.01); *H01B 13/0016* (2013.01); *Y10S 505/918* (2013.01); *Y10S 505/92* (2013.01); *Y10T 29/49014* (2015.01)

(58) Field of Classification Search
CPC ............. H01L 39/12; H01L 39/142406; H01L 39/2406; H01L 39/2409; H01B 12/02; H01B 12/04; H01B 12/10; H01B 13/0016; Y10T 29/49014; Y10S 505/806; Y10S 505/917; Y10S 505/918; Y10S 505/919; Y10S 505/92
See application file for complete search history.

(56) References Cited

U.S. PATENT DOCUMENTS

| | | | |
|---|---|---|---|
| 6,849,137 B2 * | 2/2005 | Iwaki | H01L 39/14 |
| | | | 148/98 |
| 2005/0178472 A1 * | 8/2005 | Hong | C22C 1/02 |
| | | | 148/98 |
| 2006/0081307 A1 | 4/2006 | Field | |

OTHER PUBLICATIONS

'The vital role of a well-developed Sn—Nb—Cu membrane for high Jc RRP® Nb3Sn wires' published Oct. 2016 in IEEE/CSC & ESAS Superconductivity News Forum, by Carlos Sanabria, Peter Lee, Michael Field, and David Larbalestier (Year: 2016).*

(Continued)

*Primary Examiner* — Peter Dungba Vo
*Assistant Examiner* — Joshua D Anderson
(74) *Attorney, Agent, or Firm* — Benoit & Côté Inc.

(57) ABSTRACT

A new heat treatment for Internal-Tin $Nb_3Sn$ strands is described. The heat treatment uses Nausite membranes to decrease the volume fraction of the η phase and therefore minimize its liquefaction—ultimately resulting in better connected $Nb_3Sn$. The heat treatment requires only one stage aside from the final $Nb_3Sn$ reaction stage. This heat treatment enables an increase in critical current density (at 16 T) of 28%.

6 Claims, 8 Drawing Sheets

(56) References Cited

OTHER PUBLICATIONS

Bruzek, C. et al., "Effect of heat treatments on superconducting properties of Nb3Sn strands developed at GEC AKSTHOM", IEEE Transactions on Applied Superconductivity, IEEE Service Center, Los Alamitos, CA, US Jun. 1, 1997.

Rodrigues, C.A. et al., "Development, heat treatment optimization and microstructurel characterization of Nb3Sn superconductor wire", IEEE Transactions on Applied Superconductivity, IEEE Service Center, Los Alamitos, CA, US Jun. 1, 2003.

\* cited by examiner

STRAND CRITICAL CURRENT DENSITY IN NB₃SN SUPERCONDUCTING STRANDS VIA A NOVEL HEAT TREATMENT

FIELD OF THE INVENTION

This invention relates generally to superconducting materials and processes for their manufacture. More specifically the invention provides a heat treatment to maximize the critical current density in $Nb_3Sn$ superconducting strands.

BACKGROUND OF THE INVENTION $Nb_3Sn$ superconducting strands can be manufactured by several different processes, including the Bronze Process [1], Powder in Tube [2], and Internal Tin [3]. For the Internal Tin process the diffusion barrier can be a single non-reacting barrier [4] as was used for the ITER fusion project, or have multiple distributed reactable diffusion barriers as in the Rod Restack Process [5]. Internal Tin $Nb_3Sn$ superconducting strands are fabricated by co-drawing ductile metallic alloys of Nb, Cu, and Sn (usually with alloying of Ti and/or Ta for doping purposes) in an array of features called 'sub-elements' 12, as seen in FIG. 1, which are re-stacked in a Cu jacket 11 to form the full superconductor wire precursor 10. These "green" components (Nb filaments 14, Nb barrier 15, Cu matrix 17, and Sn 13 core) are then reacted using a specific heat treatment (usually with multiple temperature holds) in order to activate the $Nb_3Sn$ formation [5] creating the superconductor. It has been noted that this heat treatment can have a large influence on the final superconducting properties of the strand. For over 50 years since the advent of internal tin $Nb_3Sn$ superconducting wires, the $Nb_3Sn$ reaction heat treatment has followed a similar multiple temperature/time stage pattern. In the past, the heat treatments of $Nb_3Sn$ wires have used many temperature holds (or dwells) which were designed to homogenize the Cu—Sn mix before going through phase transitions [6]—as well as to avoid porosity [7]. The different dwells historically used for Internal-Tin $Nb_3Sn$ strands as well as justification for their use are described below.

1. Initial Tin Mixing Dwell: 210-215° C.: This dwell is used often to homogenize the Cu—Sn mix as much as possible to transform the pure Sn into the η phase before crossing the melting temperature of pure Sn at 227° C. (as to prevent its liquefaction) [8]. It has also been suggested that this dwell will "wet" the grain boundaries and prevent porosity. Time length of dwell is typically 24-100 hours.

2. Bronze Phase Mixing Dwell: either (a) 340° C.: This dwell is used in strands with relatively low Sn content strands designed for low AC losses. This dwell was suggested to homogenize as much as possible before crossing the formation temperature of the δ phase, since it has been implied that this phase is related to porosity[9] or (b) 400° C.: This dwell is associated with strands with relatively high Sn content designed for maximum critical current density. As seen in FIG. 2, This dwell was suggested to mix the Cu—Sn as much as possible to transform the η phase 18 into the ε phase 19 [10]—before crossing the melting temperature of the η phase [8]. However it should be mentioned that the mixing was expected to happen within the filaments [4] instead of inside the core, as the Sn—Nb—Cu ternary membrane 20 permits.

3. Bridging prevention dwell: 450° C.: This dwell is used in strands with relatively low Sn content strands designed for low AC losses. This dwell is reported to produce a significant amount of porosity that could prevent filament bridging (if this is desired) [11].

4. Distribution of Bronze Throughout the Filament Pack Dwell: 575° C.: This dwell is reported as a compromise between minimum $Nb_3Sn$ formation and uniform distribution of Sn within the filaments [10], to homogenize the phase surrounding the filaments before the reaction to form $Nb_3Sn$ takes place.

5. $Nb_3Sn$ Reaction Dwell: 620° C.-700° C.: This final dwell is the $Nb_3Sn$ reaction stage, where Nb reacts with Sn in the presence of Cu to form $Nb_3Sn$.

SUMMARY OF THE INVENTION

In a first aspect, the present invention provides a method for producing a high current density $Nb_3Sn$ superconducting wire featuring (a) fabricating a Cu clad internal tin $Nb_3Sn$ precursor wire containing Nb, Sn, Cu and a dopant of Ti and or Ta, drawn to an outer wire diameter between 0.2 mm and 2.0 mm; (b) performing a heat treatment reaction where a Cu Diffusion plateau between 350° C. and 380° C. is provided for 24 to 400 hours before continuing to the $Nb_3Sn$ reaction plateau which is above 620° C. and below 750° C. and held for 24 to 400 hours. In some instances, in a) the metal ratios within and including the diffusion barrier may be, for instance, a Nb fraction of 50-65% by area, an Sn fraction of 20-25% by area, and the dopant element if Ta, is part of the Nb fraction, with a preferred alloy of Nb7.5 wt % Ta, or if Ti, is employed as Ti or Nb47 wt % Ti rods of ~1-2% by area, and the Cu fraction may be the balance.

The Cu diffusion plateau temperature may be preferably between 350° C. and 380° C. The Cu diffusion plateau time may be preferably between 100 and 400 hours. The $Nb_3Sn$ reaction plateau may be preferably between 620° C. and 680° C. if the dopant in a) is Ti. The $Nb_3Sn$ reaction plateau may be preferably between 650° C. and 700° C. if the dopant in a) is Ta. The $Nb_3Sn$ reaction plateau temperature may be preferably between 50-400 hours.

In a second aspect, the present invention provides a high current density $Nb_3Sn$ superconducting wire produced by the methods described herein.

DESCRIPTION OF THE PREFERRED EMBODIMENTS

Figure 3:
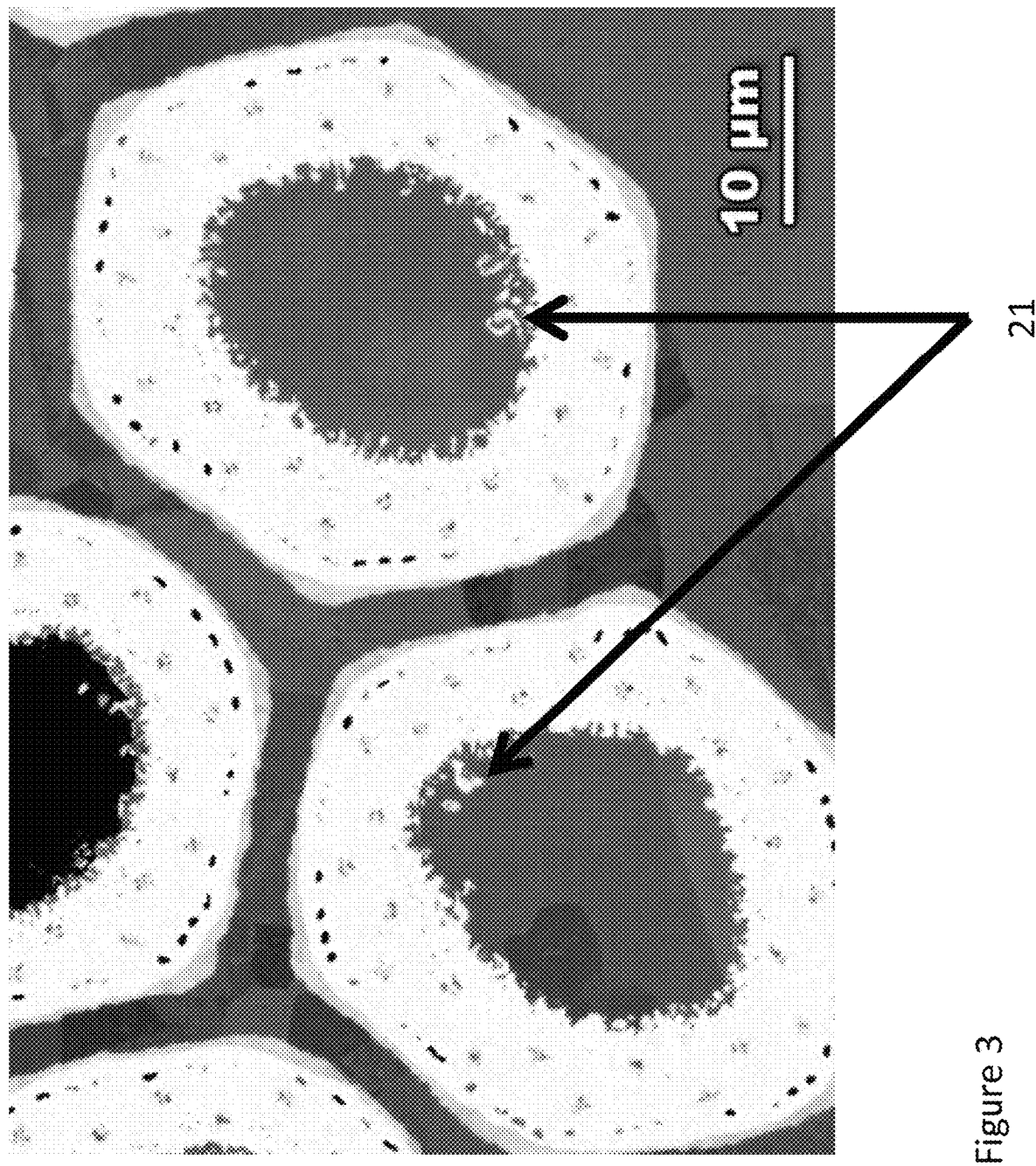
FIG. 3 is a micrograph of fully reacted sub-elements showing disconnected $Nb_3Sn$ as a result of Nausite formation.

For many years it has been noticed that, as shown in FIG. 3, some $Nb_3Sn$ 21 ends up disconnected from the main ring

Figure 1:
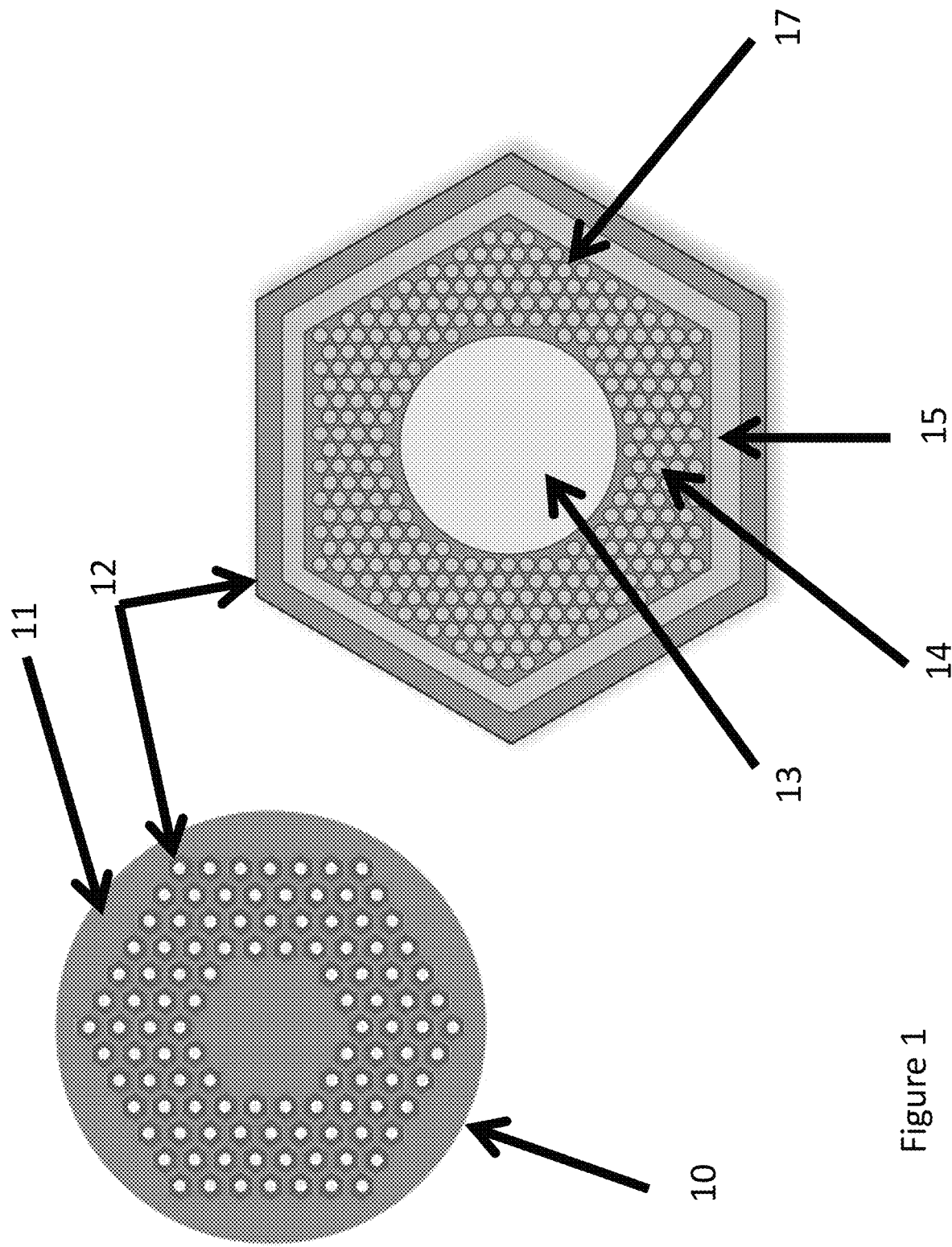
FIG. 1 is an illustration of a distributed barrier Internal-Tin strand.
Figure 2:
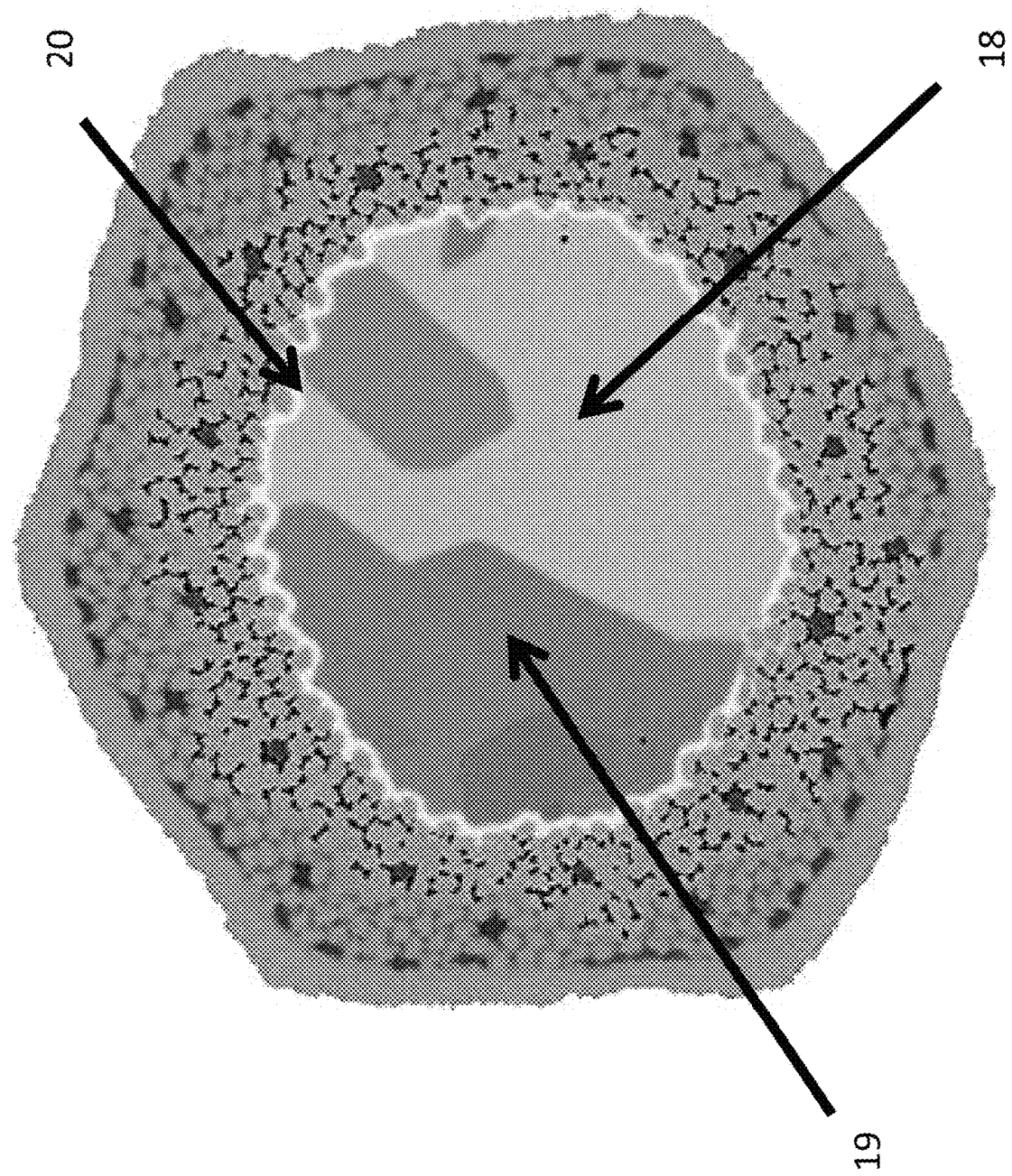
FIG. 2 is micrograph of a partially reacted sub-element showing Nausite growth in the form of a membrane.

[12] and therefore cannot contribute to current transport. This disconnection is a result of the Sn—Nb—Cu ternary phase, identified as $(Nb_{0.75}Cu_{0.25})Sn_2$ [13] and denominated "Nausite", which forms at two instances during heat treatment:

1. The first formation of Nausite has the shape of a ring (or a membrane) that sits between the Cu/Nb filament pack and the Cu—Sn core (as seen in FIG. 2). This Nausite membrane 20 is formed below 408° C. (the melting temperature of the Cu—Sn phase η or $Cu_6Sn_5$). When formed, the Nausite membrane enables Cu diffusion to the core while blocking Sn diffusion outwards. Such Cu diffusion is beneficial to consume the η phase and produce more of the ε phase with a higher melting point. Unfortunately the membrane grows with time, producing more Nausite that results in disconnected $Nb_3Sn$ as previously stated. It does not appear of critical importance if this stage is preceded or not by a 210-215° C. Internal Tin Mixing dwell stage.

Figure 4:
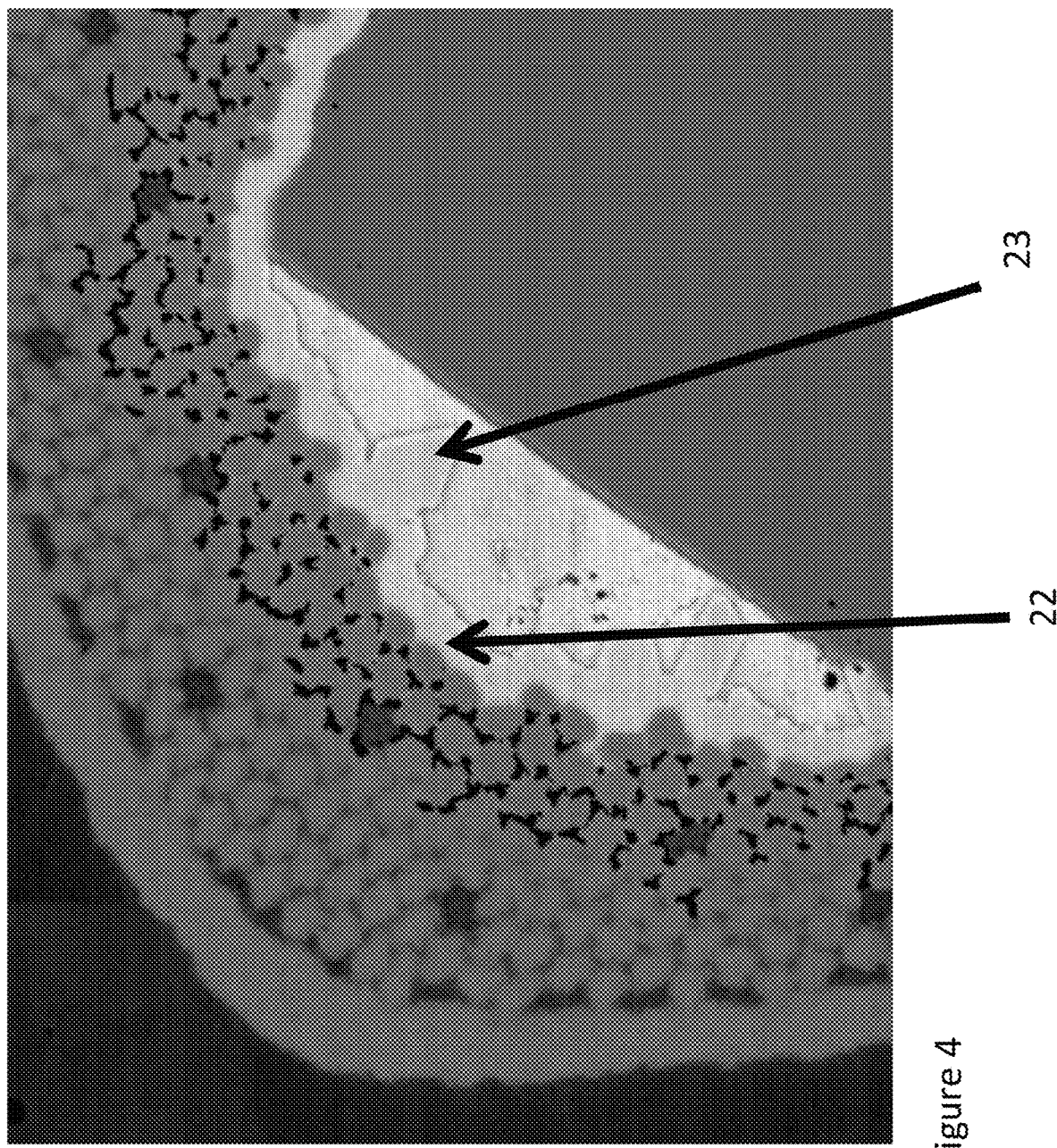
FIG. 4 is micrograph of a partially reacted sub-element showing rapid Nausite growth after the liquefaction of the η phase.

2. The second formation of Nausite 22 happens above 408° C. upon the liquefaction of the η phase, and as shown in FIG. 4 it manifests in very large grains. The liquid corrodes the Nb filaments and produces large pieces of Nausite 23 rapidly which (as before) result in disconnected $Nb_3Sn$.

The novel heat treatment process described herein uses the Nausite membrane advantageously in order to diffuse the highest amount of Cu into the core (consuming as much η as possible and therefore preventing liquefaction) while at the same time inhibiting the growth of the Nausite as a membrane.

A difference between the novel heat treatment process described herein and those of the prior art described above is that the novel heat treatment process described herein doesn't focus on phase transformations or porosity. Rather, the present heat treatment process focuses on the formation of a Nausite membrane in order to facilitate the Cu diffusion to the core and prevent the liquefaction of η as much as possible.

Figure 5:
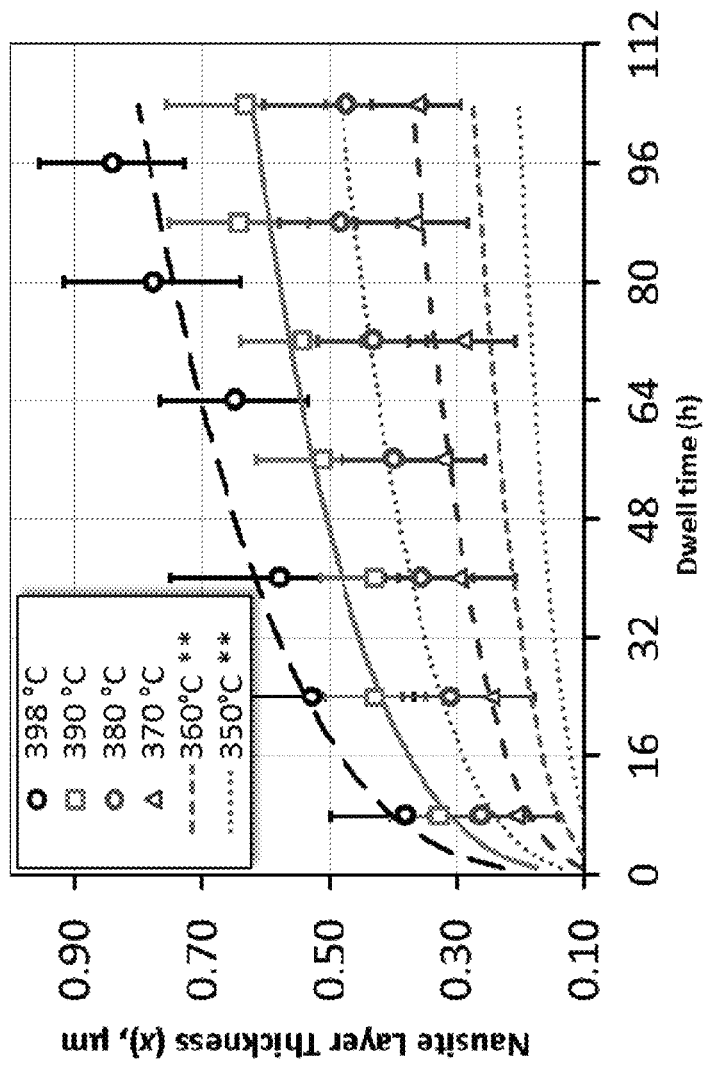
FIG. 5 is a plot of Nausite membrane thicknesses as a function of time at various temperatures. Values marked with ** are predicted values that were later confirmed.
Figure 6:
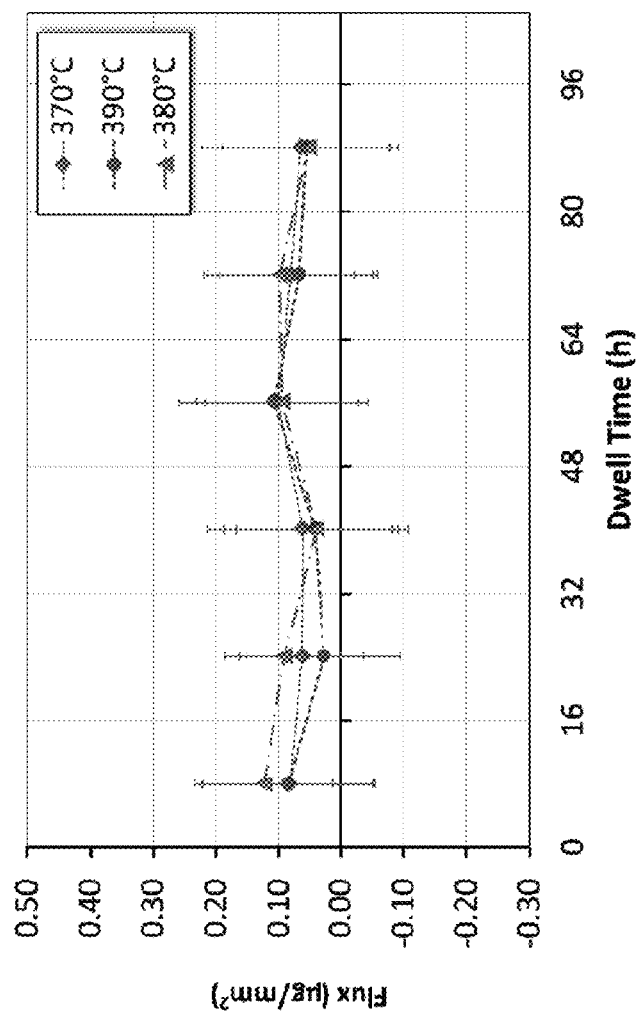
FIG. 6 is a plot of Cu flux through the Nausite membrane.

The Nausite membrane can form in as little as 8 hours between 400° C. and 350° C. FIG. 5 shows the Nausite membrane thickness growth as a function of time. Since the Nausite phase produces disconnected $Nb_3Sn$, lower temperatures are desired; however this membrane doesn't seem to grow continuously below 300° C. Once the membrane is formed, the Cu diffusion is activated, a diffusion which is weakly dependent on temperature between 400° C. and 370° C. as is shown in FIG. 6. It should be noted that the Cu diffusion slows down to impractical amounts below 350° C.

Figure 7:
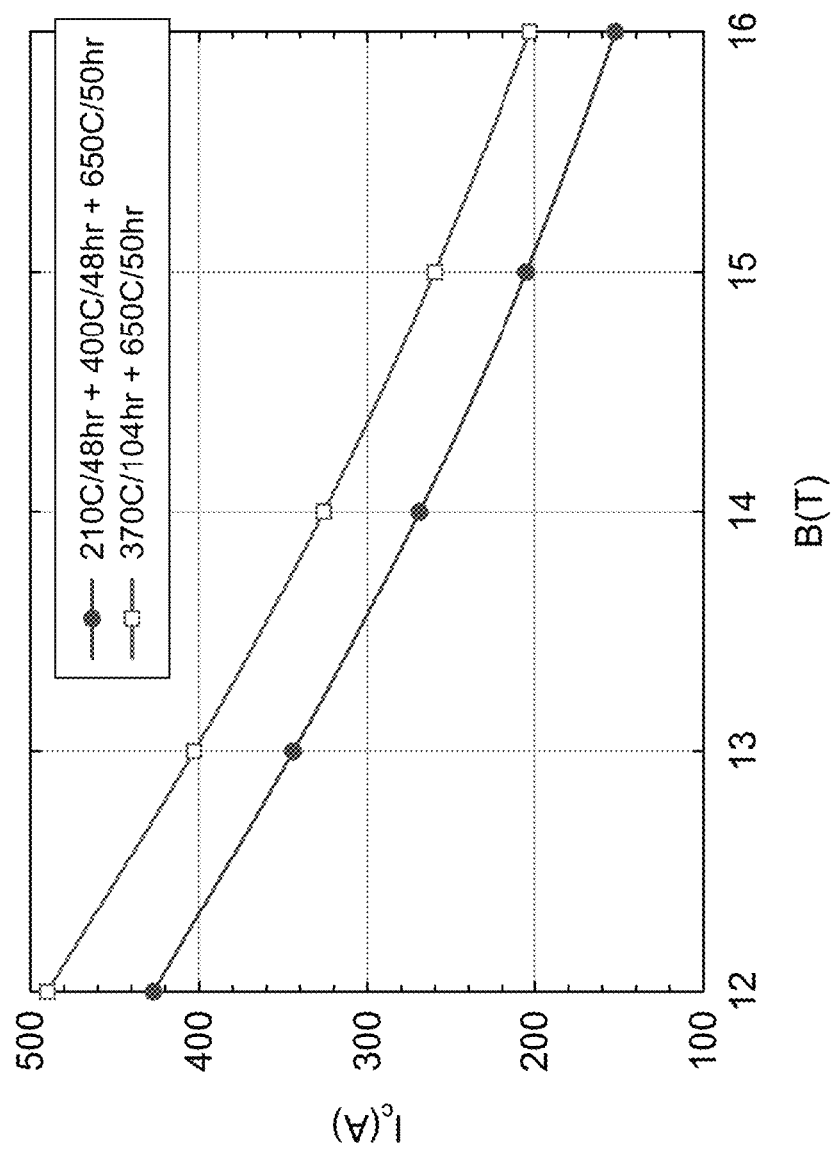
FIG. 7 is a plot of $I_c$ increase of a wire with a sub-element diameter of 35 μm.

The heat treatment process described hererin recommends the replacement of the previously thought as a Bronze Phase Mixing Dwell with a Cu Diffusion Dwell of ~350-380° C. for >100 hours. For example, one dwell of 370° C. for 104 hours resulted in a Nausite layer thickness reduction of 46%. Due to the reduced formation of Nausite, as well as the increased Cu diffusion, this heat treatment has improved the critical current density (at 16 T) of the wires with sub-element size of 35 μm by 27% as shown in FIG. 7. Furthermore, a 360° C. dwell for 150 hours results in a Nausite layer thickness reduction of 54% (critical current density not measured).

Since at higher temperatures the Nausite membrane grows rapidly, the heat treatment dwell is recommended to be between 350° C. to 380° C., and for longer than 100 hours in order to diffuse as much Cu into the core to maximize conversion of η phase bronze to ε phase bronze. Practical limitations of the dwell time are to a maximum of approximately 400 hours. In a preferred embodiment, the heat treatment process may feature a heat treatment of 370° C./104 hr+665° C./50 hrs.

Example 1

Figure 8:
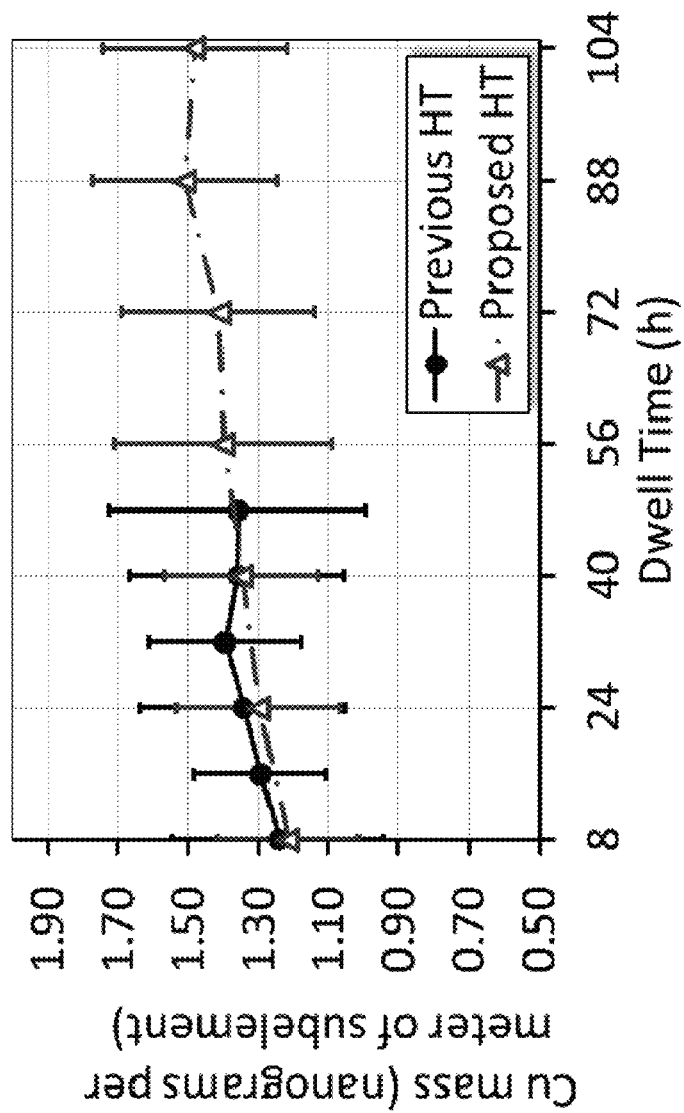
FIG. 8 is a plot of copper content inside the sub-elements of a wire using the previous heat treatment and the proposed heat treatment.

For the purpose of proving the effectiveness of the heat treatment process, it was performed on a series of distributed barrier RRP® strands [14]. These strands were manufactured from the same design to the same final diameter of 0.7 mm but nonetheless had a range in superconducting properties when heat treated with the standard heat treatment sequence: ramp from room temperature to 210° C. at a ramp rate of 25° C./hour, dwell of 210° C. for 48 hours, ramp to 400° C. at a ramp rate of 50° C./hour, dwell of 400° C. for 48 hours, and ramp to 650° C. at a ramp rate of 75° C./hour, dwell of 650° C. for 50-hours. FIG. 7 shows the Critical Current ($I_c$) at 4.2K and in an applied magnetic field of 12 T for the standard heat treatment and the heat treatment with a modified Cu mixing dwell, ramp from room temperature to 370° C. at a ramp rate of 25° C./hour, dwell of 370° C. for 104 hours, ramp to 650° C. at a ramp rate of 75° C./hour, dwell of 650° C. for 50 hours. This particular wire saw an increase of 15% in critical current at 12 T and 27% increase in critical current at 15 T when the new heat treatment was applied. This heat treatment allowed producing a Nausite membrane that is 46% thinner than that produced in the standard heat treatment and increased the Cu content in the core by 9% as shown in FIG. 8.

The exact ramp rate does not have a noticeable effect on the results of the heat treatment process. Ramp rates are generally chosen to be as fast as possible while still allowing for homogenous heating of the product; i.e. slower ramp rates are used for larger magnet coils. The practical range of ramp rates is 1° C./hour to 75° C./hour.

REFERENCES

[1] A. R. Kaufmann and J. J. Pickett, "Multifilament $Nb_3Sn$ Superconducting Wire," *J. Appl. Phys.*, vol. 42, no. 1, pp. 58-58, January 1971.

[2] C. van Beijnen and J. Elen, "Multifilament $Nb_3Sn$ superconductors produced by the E.C.N. technique," *IEEE Trans. Magn.*, vol. 15, no. 1, pp. 87-90, January 1979.

[3] Y. Hashimoto, K. Yoshizaki, and M. Tanaka, "Processing and properties of superconducting $Nb_3Sn$ filamentary wires," *Proc. Fifth Int. Cryog. Eng. Conf. ICEC*, no. Kyoto, 1974.

[4] R. Schwall, G. Ozeryansky, D. Hazelton, S. Cogan, and R. Rose, "Properties and performance of high current density Sn-core process MF $Nb_3Sn$," *IEEE Trans. Magn.*, vol. 19, no. 3, pp. 1135-1138, May 1983.

[5] M. Field, J. Parrell, Y. Zhang, and S. Hong, "Critical current density in $Nb_3Sn$ superconducting wire," U.S. Patent Publication 2006/0081307 A1, 20 Apr. 2006.

[6] N. Higuchi, K. Tsuchiya, C. J. Klamut, and M. Suenaga, "Superconducting Properties of $Nb_3Sn$ Multifilamentary Wires Fabricated by Internal Tin Process," in *Advances in Cryogenic Engineering Materials*, A. F. Clark and R. P. Reed, Eds. Springer US, 1984, pp. 739-746.

[7] E. Gregory, G. M. Ozeryansky, and M. Suenaga, "Some Effects of Porosity and Hip'ing on Critical Currents in Internal-Tin-Processed Multifilamentary $Nb_3Sn$ Wires," Brookhaven National Lab., Upton, N.Y. (United States), BNL-46846; CONF-9110306—1, January 1991.

[8] S. Fürtauer, D. Li, D. Cupid, and H. Flandorfer, "The Cu—Sn phase diagram, Part I: New experimental results," *Intermetallics*, vol. 34, pp. 142-147, March 2013.

[9] S. Cogan, S. Kwon, J. Klein, and R. Rose, "Fabrication of large diameter external-diffusion processed Nb₃Sn composites," *IEEE Trans. Magn.*, vol. 19, no. 3, pp. 1139-1142, May 1983.

[10] A. McInturff and D. Larbalestier, "Effect of metallurgical history on '$J_c$(5T)' in surface diffused multifilamentary Nb₃Sn," *IEEE Trans. Magn.*, vol. 11, no. 2, pp. 259-262, March 1975.

[11] E. Gregory, E. A. Gulko, and T. Pyon, "Improvements in the properties of internal-tin Nb₃Sn," *IEEE Trans. Appl. Supercond.*, vol. 7, no. 2, pp. 1498-1503, June 1997.

[12] J. A. Parrell, Y. Zhang, M. B. Field, P. Cisek, and S. Hong, "High field Nb₃Sn conductor development at Oxford Superconducting Technology," *IEEE Trans. Appl. Supercond.*, vol. 13, no. 2, pp. 3470-3473, 2003.

[13] S. Martin, A. Walnsch, G. Nolze, A. Leineweber, F. Léaux, and C. Scheuerlein, "The crystal structure of (Nb0.75Cu0.25)Sn2 in the Cu—Nb—Sn system," *Intermetallics*, vol. 80, pp. 16-21, January 2017.

[14] M. Field, J. Parrell, Y. Zhang, and S. Hong, "Critical current density in Nb₃Sn superconducting wire," U.S. Pat. No. 7,368,021 B2, 6 May 2008.

The invention claimed is:

1. A method for producing a high current density Nb₃Sn superconducting wire comprising the steps of:

a) fabricating a Cu clad internal tin Nb₃Sn precursor wire containing Nb, Sn, Cu and a dopant of Ti and or Ta, drawn to an outer wire diameter between 0.2 mm and 2.0 mm, the precursor wire having a composition with an Nb fraction of 50-65% by area and an Sn fraction of 20-25% by area, with a Cu fraction representing the balance of the composition; and b) performing a heat treatment reaction wherein a Cu diffusion plateau between 350° C. and 380° C. is performed for 100 to 400 hours, thereby significantly reducing formation of $(Nb_{0.75}Cu_{0.25})Sn_2$ ("Nausite"), and a Nb₃Sn reaction plateau is performed above 620° C. and below 750° C. for 24 to 400 hours.

2. A method in accordance with claim 1 wherein if the dopant element is Ta, it is part of the Nb fraction, with an alloy of Nb7.5 wt % Ta.

3. A method in accordance with claim 1 wherein, if the dopant element is Ti, it is part of Nb47 wt % Ti rods of 1-2% by area.

4. A method in accordance with claim 1, wherein the Nb₃Sn reaction plateau is between 620° C. and 680° C. if the dopant is Ti.

5. A method in accordance with claim 1, wherein the Nb₃Sn reaction plateau is between 650° C. and 700° C. if the dopant is Ta.

6. A method in accordance with claim 1, wherein the Nb₃Sn reaction plateau time is between 50-400 hours.

* * * * *